(12) United States Patent
Eidson et al.

(10) Patent No.: US 6,255,906 B1
(45) Date of Patent: Jul. 3, 2001

(54) POWER AMPLIFIER OPERATED AS AN ENVELOPE DIGITAL TO ANALOG CONVERTER WITH DIGITAL PRE-DISTORTION

(75) Inventors: Donald Brian Eidson; Mats Lindstrom; Robert Edmund Grange, all of San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/410,216

(22) Filed: Sep. 30, 1999

(51) Int. Cl.[7] .............................. H03F 3/68; H03F 1/14; H03F 1/26

(52) U.S. Cl. .................. 330/124 R; 330/51; 330/149

(58) Field of Search .................. 330/51, 124 R, 330/129, 149

(56) References Cited

U.S. PATENT DOCUMENTS

| | | | |
|---|---|---|---|
| 4,580,111 | 4/1986 | Swanson | 332/41 |
| 4,804,931 | 2/1989 | Hulick | 332/31 |
| 4,879,519 | * 11/1989 | Myer | 330/149 |
| 4,952,890 | 8/1990 | Swanson | 332/152 |
| 5,132,637 | 7/1992 | Swanson | 330/10 |
| 5,287,543 | * 2/1994 | Wolkstein | 330/124 R |
| 5,450,444 | 9/1995 | Miki et al. | 375/295 |
| 5,886,573 | * 3/1999 | Kolanek | 330/124 R |
| 5,986,500 | * 11/1999 | Park et al. | 330/51 |
| 6,054,894 | * 4/2000 | Wright et al. | 330/149 |

OTHER PUBLICATIONS

L.R. Kahn, "Single Sideband Transmission by Envelope Elimination and restoration"; *Proceedings of the IRE*, vol. 40, 1952, pp. 803–806.

* cited by examiner

Primary Examiner—Robert Pascal
Assistant Examiner—Patricia T. Nguyen
(74) Attorney, Agent, or Firm—Akin, Gump, Strauss, Hauer & Feld, L.L.P.

(57) ABSTRACT

A power amplifier that amplifies an electrical signal that is passed through a power amplification array. The power amplifier is employed in various applications including cellular telephones, radio frequency signal transmission, and other electrical signal applications requiring power amplification. The power amplifier contains a number of power amplifiers arranged in a power amplifier array. To reproduce a particular envelope profile, a selected number of the power amplifiers of the power amplifier array is switched ON, whereas another selected number of the power amplifiers of the power amplifier array are switched OFF. All elements are fed with an RF signal containing phase information as well. The amplified, output signal provided after the power amplifier array is fed to an antenna for signal transmission. Impedance matching circuitry is employed between the power amplifier array and the antenna to provide efficiency for those applications having low power budgets or seeking to operate with extremely high efficiency. The present invention provides a solution that is extremely energy efficient, making it ideally suited for applications having low available power budgets such as battery operated devices such as cellular telephones. From one perspective, the power amplifier array is operated as if it were a digital device. For example, each of the individual power amplifiers of the power amplifier array is either switched ON or switched OFF, as described above, and a selected number of the power amplifiers provides the desired level for the specific application.

20 Claims, 9 Drawing Sheets

POWER AMPLIFIER OPERATED AS AN ENVELOPE DIGITAL TO ANALOG CONVERTER WITH DIGITAL PRE-DISTORTION

BACKGROUND

1. Technical Field

The present invention relates generally to semiconductor devices; and, more particularly, it relates to power amplification circuitry.

2. Related Art

Many traditional power amplifiers feed signal with a non-constant envelope into a power amplifier array. One type of power amplifier is an envelope elimination and restoration (EER) power amplifier wherein the non-constant envelope is fed into the power amplifier so that the control of how to bias the power amplifier array is governed primarily by the non-constant envelope. One method of biasing the elimination and restoration (EER) power amplifier is to adjust the bias voltage as a function of the envelope of the electrical signal. This real time adjustment to the bias voltage presents a number of difficulties. The characteristic input impedance of the power amplifier tends to fluctuate as a function of the bias voltage provided to it. Also, the characteristic output impedance of the power amplifier tends to fluctuate as a function of the bias voltage provided to the power amplifier. In addition, the ambient environmental conditions in which the power amplifier is placed tend to affect its characteristic impedance. Absent some sophisticated compensation algorithms, conventional technologies that employ analog voltage biasing suffer from deleterious operation in dynamic environments.

There are significant problems with conventional power amplifiers in terms of efficiency of the feeding of a signal with a non-constant envelope to the power amplifier array. One particular problem is that a bias point is chosen for optimal operation at one (peak) power level. However, the non-constant envelope is inherently non-constant, therefore the power amplifier is only energy efficient at the designated peak level. In order to make the power amplifier efficient over a range of output power, its bias must be continually modified, which is substantially difficult to do. This is due largely to the real-time modification and varying of the voltage that is given to the power amplifier array which is very inefficient in terms of energy consumption.

One attempted solution to overcome the problems associated with conventional power amplifiers was the introduction in the 1950s of the elimination and restoration (EER) power amplifier. The elimination and restoration (EER) power amplifier adapts the voltage level of the voltage bias for the power amplifier array to the envelope power level of the non-constant envelope that is required at the output. This solution is one that does provide for optimal voltage bias at a variety of non-constant envelope levels, but it has many deficiencies itself. That is to say, although the solution of the elimination and restoration (EER) power amplifier does present a solution to some problems associated with conventional power amplifiers, it nevertheless introduces some undesirable problems. First, the efficiency of the bias adaptation technique employed by the elimination and restoration (EER) power amplifier inherently requires an additional amplifier. Also, the calibration of the elimination and restoration (EER) power amplifier is of utmost importance to ensure that the waveform fidelity of the waveform that is being amplified maintains its original shape including its spectral content.

The envelope digital to analog converter (DAC) power amplifier is a subset of the elimination and restoration (EER) power amplifier. Here, a power amplifier array of a power amplifier is treated as a purely digital device wherein each power amplifier within the power amplifier array is turned ON/OFF as required by the specific application. Various sizes of power amplifiers are employed within a power amplifier array to realize the required output levels within various applications. The envelope digital to analog converter (DAC) power amplifier is a very efficient technique to obtain adjustable optimal output power levels using a power amplifier. However, the deficiencies of the envelope digital to analog converter (DAC) power amplifier are great, similar to the deficiencies of the elimination and restoration (EER) power amplifier. For example, waveform fidelity of an original signal can easily be compromised without very good calibration of the envelope digital to analog converter (DAC) power amplifier. In addition, the input impedance of the envelope digital to analog converter (DAC) power amplifier tends to change as a function of the voltage that is used to bias the envelope digital to analog converter (DAC) power amplifier. Similarly, the output impedance of the envelope digital to analog converter (DAC) power amplifier tends to change as a function of the voltage that is used to bias the envelope digital to analog converter (DAC) power amplifier.

Further limitations and disadvantages of conventional and traditional systems will become apparent to one of skill in the art through comparison of such systems with the present invention as set forth in the remainder of the present application with reference to the drawings.

SUMMARY OF THE INVENTION

Various aspects of the present invention can be found in a power amplifier that amplifies an electrical signal. The power amplifier is operated as a completely digital device with a certain degree of digital pre-distortion compensation. The power amplifier contains, among other things, a number of power amplifiers connected in parallel and a control circuitry that switches on at least one power amplifier, selected from the number of power amplifiers. At least one power amplifier receives a voltage of saturation. That is to say, one of the power amplifiers is operated in a manner wherein it is fully ON or fully OFF. Either it receives a sufficient voltage that pushes it into saturation, or it receives no voltage whatsoever, i.e., cut-off. In addition, at least one additional power amplifier within the number of power amplifiers receives no voltage (cutoff) in certain embodiments of the invention.

In certain embodiments of the invention, the power amplifier amplifies an electrical signal having a magnitude and a phase. The magnitude passes through a first path as determined by the number of power amplifiers. The phase passes through a second path, also determined by the number of power amplifiers. The electrical signal is subsequently passed to an antenna. Certain embodiments of the invention also contain a time delay compensation circuitry that substantially minimizes any time delay mismatch between the first path and the second path through the number of power amplifiers, and a pre-distortion circuitry that substantially compensates for any impedance mismatch between the first path and the second path of the power amplifier and the antenna.

In certain embodiments of the invention, the first path is exclusively for an envelope and the second path is exclusively for a phase. The first path is sub-divided into parallel control word (similar to a digital to analog converter (DAC)) that enable parallel drivers which are analogous to the individual power amplifiers of a power amplifier array in the invention. The digital pre-distortion compensation compensates for gain and phase distortions that would result when the control word values change. For example, as the number of power amplifiers that are selected at any given time is changed, the input and output impedance of the power amplifier changes. The digital pre-distortion compensation, provided in accordance with the invention, provides a solution to minimize this undesirable effect and provide optimal performance.

The time delay compensation circuitry substantially minimizes any time delay mismatch between the first path and the second path performs the time delay compensation in real time. Time delay is introduced when the electrical distance between the first path and the second path (e.g. between an envelope path and a phase/RF path) are not the same. The abbreviation RF is a term of art for radio frequency and is well known in the art. Typically, these time delays are not the same because the RF components is at a very high frequency and are filtered using a band-pass filter, whereas the envelope is at a substantially low frequency are filtered using a low-pass filter. The pre-distortion circuitry substantially compensates for any time delay mismatch between the first path and the second path and is operable to perform the compensation in response to an environmental effect.

The control circuitry switches ON a selected number of the power amplifiers using a voltage of saturation. Also, the control circuitry switches OFF a remaining number of the power amplifiers with a voltage of cutoff. In certain embodiments of the invention, the number of power amplifiers is a plurality of power amplifier arrays. The level provided by the number of power amplifiers is scaled in certain embodiments of the invention. To perform impedance matching between the number of power amplifiers and the antenna, an impedance matching array is implemented. If desired, a look up table that stores an impedance characterization of the number of power amplifiers is used to control which individual impedances of the impedance matching array are switched in to perform the impedance matching. Another look up table is used, in other embodiments of the invention, to store a level profile of at least one power amplifier. The level profile is used to assist in the switching of the selected power amplifiers, selected from the number of power amplifiers.

Other aspects, advantages and novel features of the present invention will become apparent from the following detailed description of the invention when considered in conjunction with the accompanying drawings.

DETAILED DESCRIPTION

The present invention operates by de-coupling a waveform, or input signal, into its envelope and phase components, respectively. The phase is modulated on a carrier frequency and the envelope is re-imposed at the power amplifier. The power amplifier contains an "array" of switches is how the envelope is re-imposed at a power amplifier array of the power amplifier.

Figure 1:
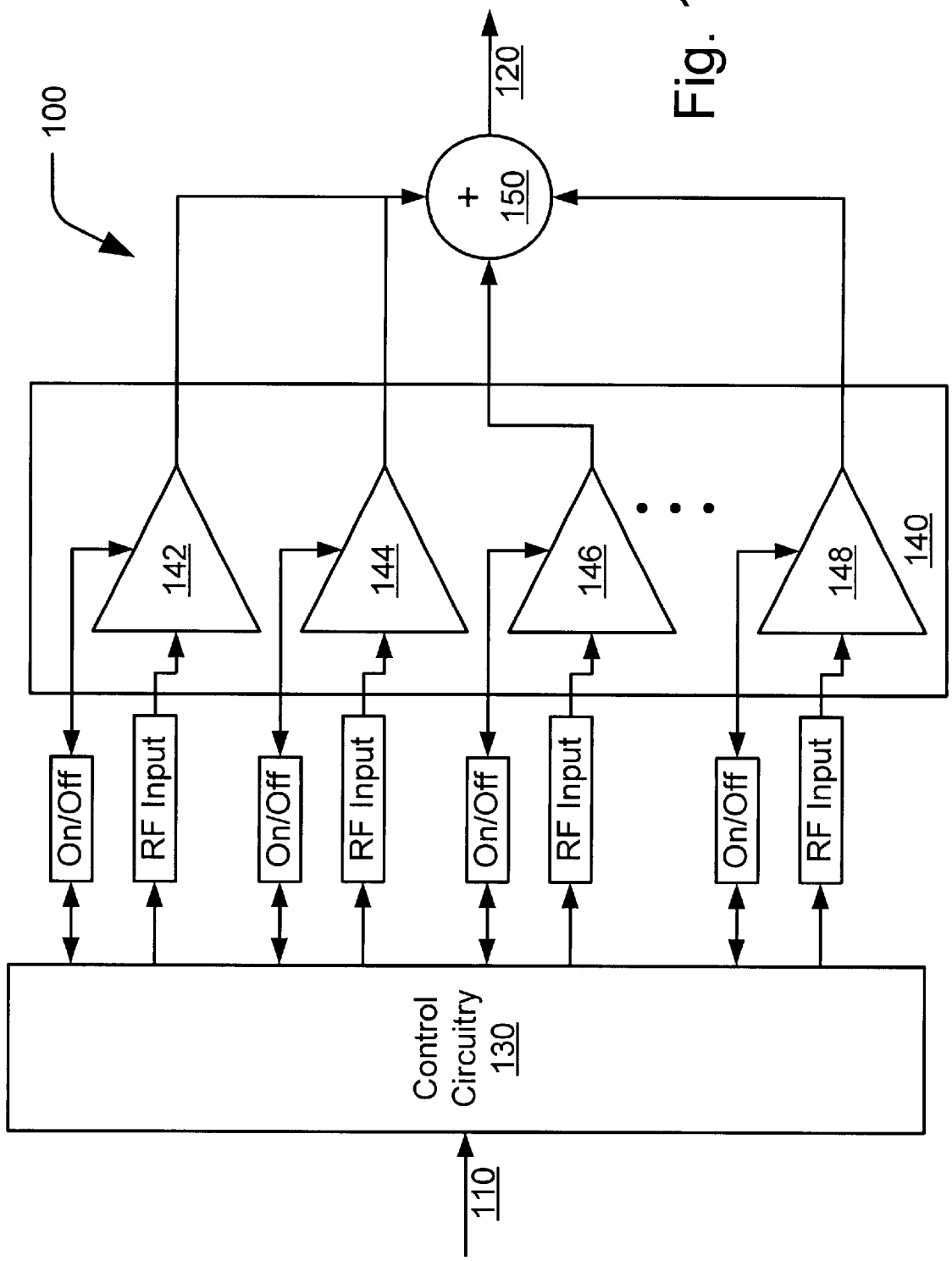
FIG. 1 is a system diagram illustrating the present invention that, in one embodiment, is a power amplifier whose operation is governed by control circuitry.

FIG. 1 is a system diagram illustrating the present invention that, in one embodiment, is a power amplifier 100 whose operation is governed by control circuitry. An input signal 110 is fed into control circuitry 130. The control circuitry 130 is used to control the voltage that is switched ON and OFF to control the operation of a power amplifier array 140. Depending on the particular type of power amplification required to be performed by the power amplifier array 140, the control circuitry 130 controls the voltage being given to the power amplifier array 140, depending on which is used to control the switching. The power amplifier array 140 itself contains a first power amplifier 142, a second power amplifier 144, a third power amplifier 146, and an $n^{th}$ power amplifier 148. The power amplifier array 140 provides a plurality of outputs, each of the plurality of outputs from the first power amplifier 142, the second power amplifier 144, the third power amplifier 146, and the $n^{th}$ power amplifier 148, is fed into a summing circuitry 150. An output signal 120 results from the summation of the outputs of the first power amplifier 142, the second power amplifier 144, the third power amplifier 146, and the $n^{th}$ power amplifier 148, after having passed through the summing circuitry 150.

In certain embodiments of the invention, the control circuitry 130 provides a voltage such that each of the first power amplifier 142, the second power amplifier 144, the third power amplifier 146, and the $n^{th}$ power amplifier 148 is either switched ON or switched OFF. In other words, each of the first power amplifier 142, the second power amplifier 144, the third power amplifier 146, and the $n^{th}$ power amplifier 148 is provides a voltage of either saturation (for ON) or no voltage or cutoff (for OFF). As governed by the specific application at hand, the desired overall power as required by the power amplifier 100 provides a predetermined amount of the overall level using a selected number of the first power amplifier 142, the second power amplifier 144, the third power amplifier 146, and the $n^{th}$ power amplifier 148. For example, if the power gain of each of the first power amplifier 142, the second power amplifier 144, the third power amplifier 146, and the $n^{th}$ power amplifier 148 is equal in magnitude, then a highest resolution of power capable of being provided by the power amplifier 100 through the power amplifier array 140 would be the specific magnitude of each of the individual power amplifiers constituting the array. Alternatively, if the levels of each of the first power amplifier 142, the second power amplifier 144, the third power amplifier 146, and the $n^{th}$ power amplifier 148 are scaled to provide more precise resolution of output power, then the highest resolution of level capable of being provided by the power amplifier 100 through the power amplifier array 140 would be the specific magnitude of the individual power amplifier within the power amplifier array 140 having the smallest overall power output. Various embodiments are envisioned within the power amplifier 100 wherein the power amplifiers, the first power amplifier 142, the second power amplifier 144, the third power amplifier 146, and the $n^{th}$ power amplifier 148, of the power amplifier array 140 are scaled in various manners. For example, the power amplifier array 140 is scaled linearly (with respect to power) in certain embodiments of the invention; alternatively, the power amplifier array 140 is scaled logarithmically in other embodiments of the invention. The power amplifier array 140 is binary scaled in even other embodiments of the invention wherein a single digital control word controls the switching ON and OFF of the first power amplifier 142, the second power amplifier 144, the third power amplifier 146, and the $n^{th}$ power amplifier 148. The power amplifier array 140 is scaled in multiples of "2" so that digital input words are provided to control the power amplifier array 140, i.e., "000" to provide no gain, "001" to provide nominal gain, "010" to provide twice the gain, "100" to provide twice the gain of "010", and etc. Any size of digital input word is used so that the digital input word width corresponds to the number of power amplifiers in the power amplifier array 140.

Any ON/OFF switching manner, wherein the individual power amplifiers of the power amplifier array 140 have substantially equal or varying individual levels and are provided with a voltage of either saturation or cutoff, is envisioned in the scope and spirit of the invention. The ON/OFF switching controls the total power emanating from the parallel concatenation of power amplifiers constituting the power amplifier array 140 within the power amplifier 100.

The power amplifier 100 is used to operate a variety of devices having a requirement for electrical signal amplification. Examples of such application areas include, but are by no means limited to, cellular telephones, cordless telephones, two-way radios, stereo equipment, and repeaters employed in long haul telecommunication systems. The power amplifier 100 is amenable to power amplification in virtually any area of electronic devices. When employed as indicated below, the power amplifier 100 provides an energy efficient solution for power amplification with minimal distortion to the input signal 110.

The ON/OFF switching method employed by the power amplifier 100 is very power efficient. Switching of the first power amplifier 142, the second power amplifier 144, the third power amplifier 146, and the $n^{th}$ power amplifier 148 of the power amplifier array 140 contained within the power amplifier 100 is the most power efficient method known in the art. However and unfortunately, a single switching power amplifier is very non-linear and introduces a large amount of distortion to the input signal 110 upon its amplification. The invention ties a number of power amplifiers together and provides proper scaling and proper digital pre-distortion compensation to realize a linear, near-distortion-free operation.

Figure 2:
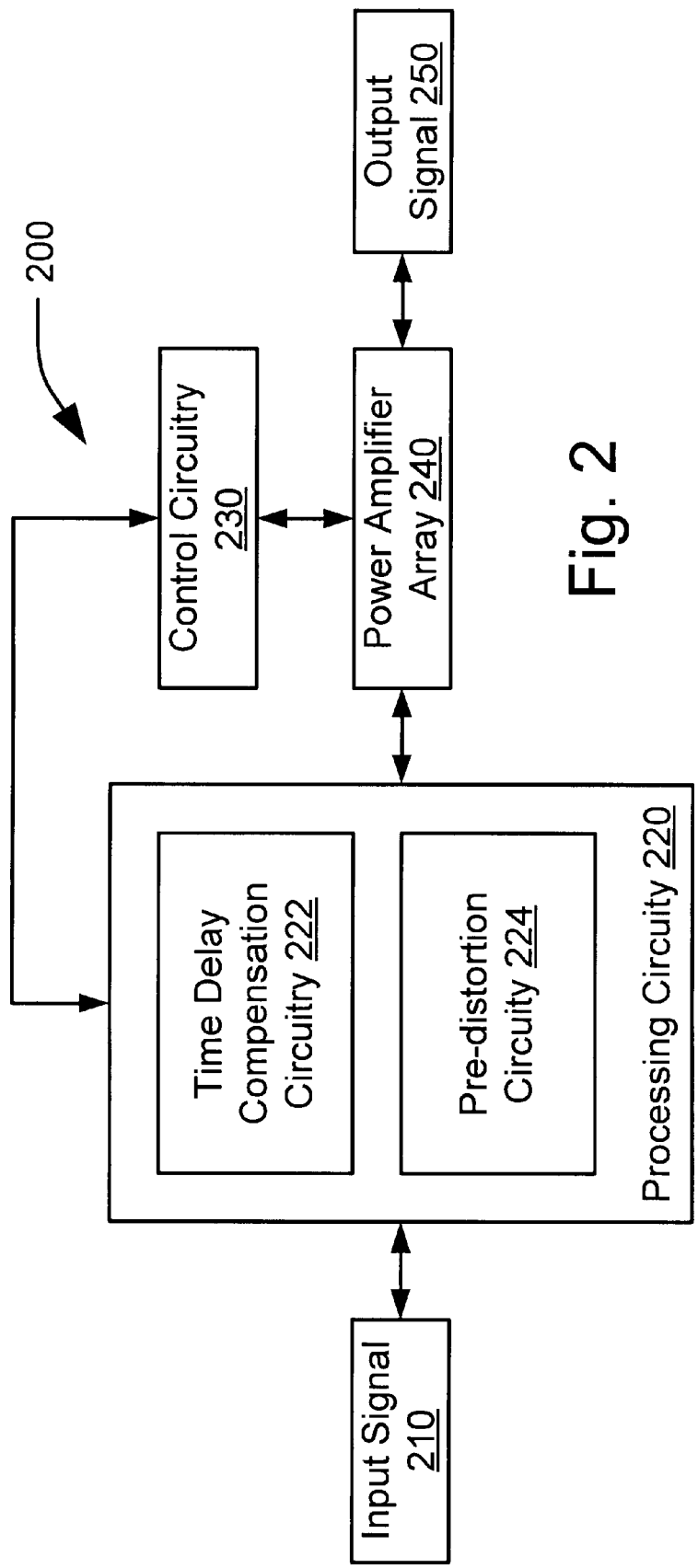
FIG. 2 is a system diagram illustrating another embodiment of the power amplifier built in accordance with the invention as described in FIG. 1.

FIG. 2 is a system diagram illustrating another embodiment of a power amplifier 200 built in accordance with the invention as described in FIG. 1. The power amplifier 200 has an input signal 210, and an output signal 250. The input signal 210 is fed into processing circuitry 220 prior to being delivered to a power amplifier array 240. The power amplifier array 240 subsequently provides the output signal 250. The processing circuitry 220 itself contains, among other things, time delay compensation circuitry 222 and pre-distortion circuitry 224. The time delay compensation circuitry 222 and the pre-distortion circuitry 224 operate cooperatively with control circuitry 230 to condition the input signal 210 prior to its being passed to the power amplifier array 240 while ensuring proper alignment of the envelope and frequency modulation (FM) components of the input signal 210, thereby maintaining proper amplification and proper reproduction of the output signal 250. The pre-distortion circuitry 224 compensates for impedance mismatches within the various power amplifiers within the power amplifier array 240. The time delay compensation circuitry 222 compensates for time delay mismatches that occur when the propagation paths for the envelope and FM components of the input signal 210 traverse different electrical lengths, throughout various components of the power amplifier 200, before being converted into the output signal 250. In certain embodiments of the invention employing some circuitry that is digital, at least in part, with other circuitry that is analog, at least in part, such electrical length mismatches will no doubt be observed. The time delay compensation circuitry 222 ensures that the envelope and FM portions of the output signal 250 are properly aligned, thereby substantially minimizing any undesirable distortion to the input signal 210. In general, the FM portions of the output signal 250 "see" a different impedance, and thereby suffer a different time delay because it has been modulated to a much higher frequency, e.g., 1.9 GHz whereas the envelope stays at a substantially low frequency. The bandwidth of its signal is also typically different. The constant envelope signal requires more bandwidth for distortion-free transmission.

In certain embodiments of the invention, the time delay compensation provided by the time delay compensation circuitry 222 is constant and irrespective to any environmental effects or other effects; alternatively, the time delay compensation circuitry 222 provides real time adjustment to environmental effects. Examples of such environmental effects include variations in ambient temperature and humidity that affect the operation of the power amplifier 200; in addition, variations in battery voltage can occur during operation thereby causing some form time delay difference requiring of adjustment using the time delay compensation circuitry 222. However, fast time delay variability is complicated at high rates of operation, and it is not recommended for ideal performance of the power amplifier 200. This fast time delay variability leads to sample repeats, skips, and a generation of spurs. The environmental effects described above affect, among other things, the voltage level of the power supply used by the ON/OFF switches of each of the individual power amplifiers of the power amplifier array 240, as well as the individual impedance of each the individual power amplifiers of the power amplifier array 240. This is often due to aging of the power supply and any associated corrosion around the terminals of the power supply. An example of an effect of environmental perturbation affecting the performance of the power amplifier 200 is the impedance of individual power amplifiers of the power amplifier array 240. Humidity is another factor that create environmental perturbations over substantially long time periods. This impedance variation affects the time delay between the envelope and FM components of the input signal 210, in that, at least two different electrical lengths are seen by the two components, respectively. The time delay compensation circuitry 222 is amenable to adjust, in either a constant or real time manner, to the various perturbations described above that limit the overall performance of the power amplifier 200.

Figure 3:
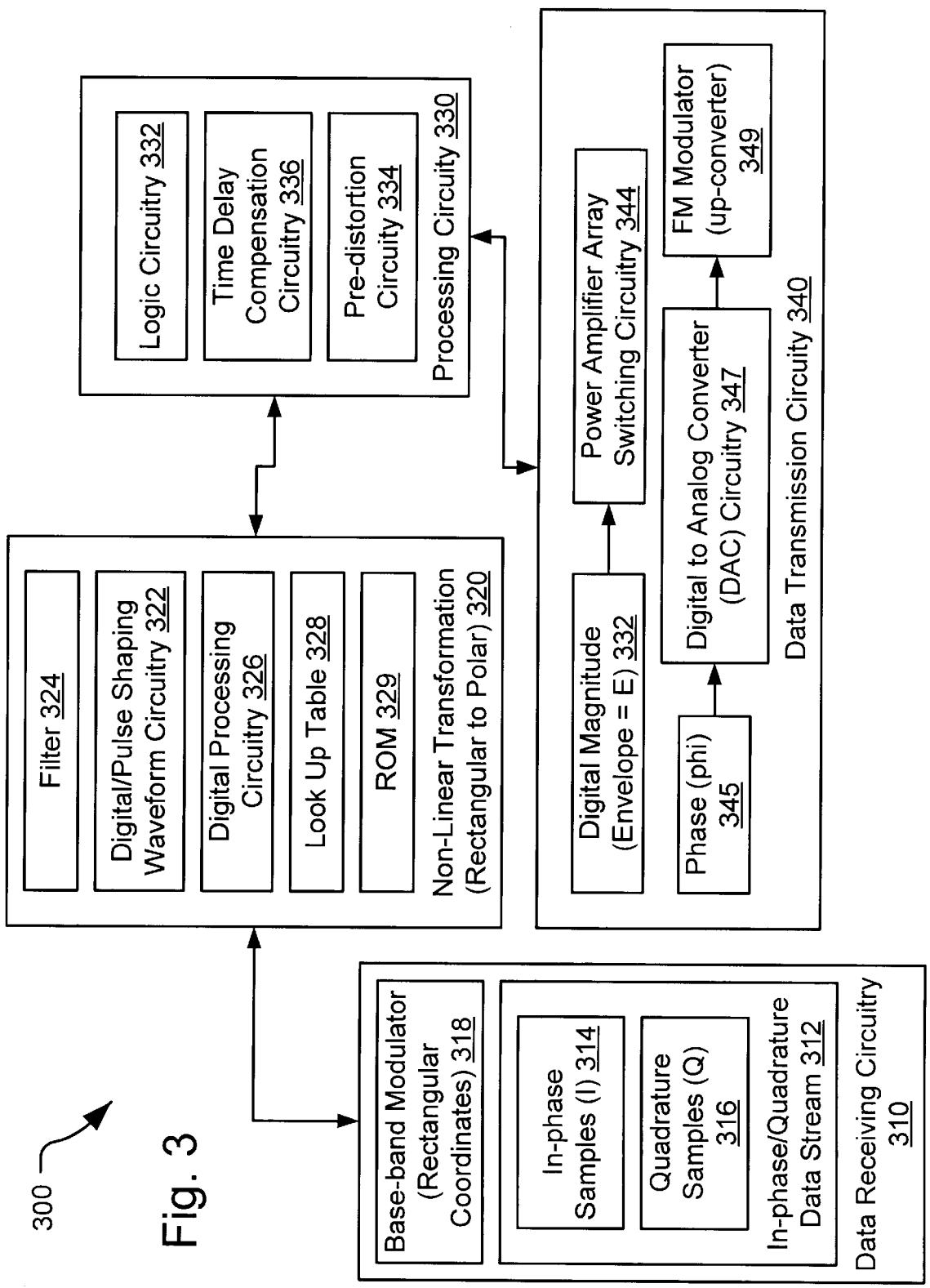
FIG. 3 is a system diagram illustrating one particular embodiment of a data processing structure for the power amplifier built in accordance with the invention as described in FIG. 1.

FIG. 3 is a system diagram illustrating one particular embodiment of a data processing structure 300 for a power amplifier built in accordance with the invention as described in FIG. 1. The data processing structure 300 contains, among other things, data receiving circuitry 310, non-linear transformation (rectangular to polar) circuitry 320, processing circuitry 330, and data transmission circuitry 340. The data receiving circuitry 310 itself contains, among other things, in-phase/quadrature data stream 312 and base-band modulator (rectangular coordinates) 318. Moreover, the in-phase/quadrature data stream 312 contains in-phase samples (I) 314 and quadrature samples (Q) 316. The non-linear transformation (rectangular to polar) circuitry 320 itself contains, among other things, digital/pulse shaping waveform circuitry 322, a filter 324, digital processing circuitry 326, a look up table 328, and a read only memory (ROM) 329. The processing circuitry 330 itself contains, among other things, logic circuitry 332, pre-distortion circuitry 334, and time delay compensation circuitry 336. The data transmission circuitry 340, itself contains, among other things, a digital magnitude (envelope=E) 342, power amplifier array switching circuitry 344. Data transfer within the data transmission circuitry 340 occurs through a phase (φ) 345, a digital to analog converter (DAC) circuitry 347, resulting in a frequency modulation (FM) modulator (up-converter) 349.

The data processing structure 300 operates on an incoming data stream, namely, the in-phase/quadrature data stream 312 having both the in-phase samples (I) 314 and the quadrature samples (Q) 316. Data streams having in-phase and quadrature components are known to those having skill in the art of communications signal processing. The baseband modulator (rectangular coordinates) 318 generates the in-phase samples (I) 314 and the quadrature samples (Q) 316 from an input bit stream, digitally filtering it as necessary to produce spectral confinement. This filtering is referred to as "pulse-shaping" and is predetermined by the communication standard to which a design must ensure the power amplifier complies. The polar conversion is typically performed at the same rate at which the in-phase samples (I) 314 and the quadrature samples (Q) 316 from the input bit stream are provided. The Nyquist convention of providing at least two times over-sampling is used in certain embodiments of the invention. The in-phase samples (I) 314 and the quadrature samples (Q) 316 from the input bit stream are provided at a rate of at least two times the symbol rate and is typically over-sampled much more than two times the symbol rate to reduce requirements on the smoothing/interpolation filter following the output of the digital to analog converter (DAC) circuitry. Also, non-linear conversion increases the re-imposed bandwidth of the envelope and phase signals which forces a designer of the system to increase the sampling rate. If the sampling rate is not increased, the system suffers from aliasing in some cases. The in-phase/quadrature data stream 312, with its embedded in-phase samples (I) 314 and the quadrature samples (Q) 316, is passed to the non-linear transformation (rectangular to polar) circuitry 320 to perform the transformation from the rectangular coordinates to the polar coordinates.

The look up table 328 is used in certain embodiments of the invention to provide efficient performance of this rectangular to polar transformation. The look up table 328 itself is pre-distorted so that, in certain embodiments of the invention, the conversion into the polar domain of the digital magnitude (envelope=E) 342 inherently contains all the necessary information for any digital pre-distortion compensation in accordance with the invention. That is to say, any operation that is performed by the pre-distortion circuitry 334 and the time delay compensation circuitry 336 (both of the processing circuitry 330) on the phase (φ) 345 need not be performed on the digital magnitude (envelope=E) 342, as that digital pre-distortion compensation is already contained in the non-linear transformation (rectangular to polar) circuitry 320 as provided by the look up table 328. The digital/pulse shaping waveform circuitry 322 also assists in performing the rectangular to polar transformation. The in-phase/quadrature data stream 312 is digitally converted to polar coordinates in a digital format. These coordinates are then converted to analog waveforms with a digital to analog converter (DAC) circuitry. Subsequently, the analog waveforms are passed through analog smoothing filters to eliminate "edges" due to the "sampled hold" that is generated at the digital to analog converter (DAC) circuitry outputs. The filter 324 ensures an accurate representation of the in-phase/quadrature data stream 312 in the polar domain. The digital processing circuitry 326 assists in the processing required to perform the rectangular to polar transformation. The digital processing circuitry 326 consist of circuitry know to those having skill in the art of digital signal processing. In certain embodiments of the invention, the read only memory (ROM) 329 (or synthesized logic) is used in place of or in conjunction with the look up table 323 to store the mathematical mapping required to perform the rectangular to polar transformation in an efficient and speedy manner. The time delay compensation circuitry 336 occurs before feeding the digital signals to the data transmission circuitry 340, and specifically to the digital to analog converter (DAC) circuitry 347 of the data transmission circuitry 340. This is accomplished, among other ways, by a programmable tapped delay line. The a digital magnitude (envelope=E) 342 itself is not converted using the digital to analog converter (DAC) circuitry 347 of the data transmission circuitry 340 because in its digital representation, it is operable to switch the power amplifier array switching circuitry 344. After the in-phase/quadrature data stream 312 has been fully transformed from the rectangular domain to the polar domain, it is passed to the processing circuitry 330.

The data transmission circuitry 340 operates on the digital magnitude (envelope=E) 342 and the phase (φ) 345. The digital magnitude (envelope=E) 342 is used to control the switching ON and OFF of a power amplifier array by operating in conjunction with the power amplifier array switching circuitry 344. For example, the magnitude (envelope=E) 342 determines, among other things, the number of individual power amplifiers of the power amplifier array are to be switched ON and which are to be switched OFF. This determination is performed using the power amplifier array switching circuitry 344. In certain embodiments of the invention, the power amplifier array switching circuitry 344, as driven by the digital magnitude (envelope=E) 342, performs the switching ON to a first predetermined number of individual power amplifiers within the power amplifier array and a switching to OFF to a second predetermined number of individual power amplifiers within the power amplifier array. As described above in various embodiments of the invention, the digital magnitude (envelope=E) 342 is a digital word wherein the most significant bit (MSB) corresponds to the largest power output element in the power amplifier operated in accordance with the invention and the least significant bit (LSB) corresponds to the smallest power output element. In such a case, each of the power amplifiers of a power amplifier array of the invention are switched either ON or OFF at any given time to accommodate the gain required by the specific application. The phase ($\phi$) 345 is fed through the digital to analog converter (DAC) circuitry 347 which provides an intermediary output that feeds the frequency modulation (FM) modulator (up-converter) 349. Alternatively, the phase ($\phi$) 345 is in a digital format for input to the frequency modulation (FM) modulator (up-converter) 349.

Figure 3B:
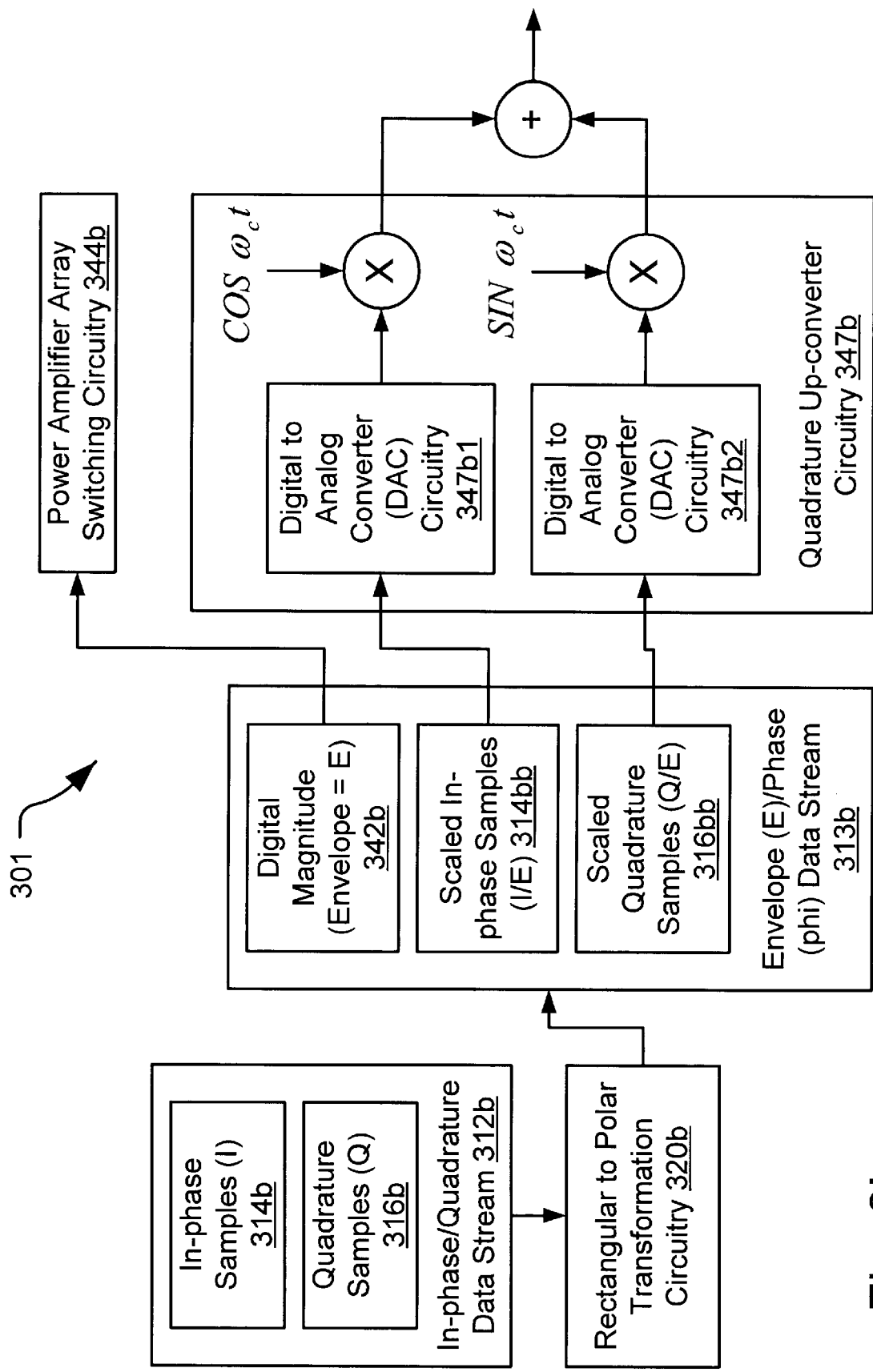
FIG. 3B is a system diagram illustrating one particular embodiment of the data processing structure for the power amplifier built in accordance with the invention as described in FIG. 3.

FIG. 3B is a system diagram illustrating one particular embodiment of the data processing structure 301 for the power amplifier built in accordance with the invention as described in FIG. 3. The data processing structure 301 receives an in-phase/quadrature data stream 312b. The in-phase/quadrature data stream 312b itself is composed of in-phase samples (I) 314b and quadrature samples (Q) 316b. The in-phase samples (I) 314b and quadrature samples (Q) 316b of the in-phase/quadrature data stream 312b are fed to a rectangular to polar transformation circuitry 320b. The rectangular to polar transformation circuitry 320b performs the transformation of the in-phase samples (I) 314b and quadrature samples (Q) 316b of the in-phase/quadrature data stream 312b and provides an envelope (E)/phase ($\phi$) data stream 313b. The envelope (E)/phase ($\phi$) data stream 313b itself contains a digital magnitude (envelope=E) 342b, scaled in-phase samples (I/E) 314bb and scaled quadrature samples (Q/E) 316bb. The digital magnitude (envelope=E) 342b, being itself a digital word, inherently contains the information required to perform the switching ON and OFF of a power amplifier built in accordance with the invention. The digital magnitude (envelope=E) 342b id provided directly to a power amplifier array switching circuitry 344b for performing the switching ON and OFF as described above in various embodiments of the invention. The scaled in-phase samples (I/E) 314bb and the scaled quadrature samples (Q/E) 316bb are both provided to a quadrature up-converter circuitry 347b. The quadrature up-converter circuitry 347b itself contains an analog converter (DAC) circuitry 347b1 that receives the scaled in-phase samples (I/E) 314bb and an analog converter (DAC) circuitry 347b2 that receives the scaled quadrature samples (Q/E) 316bb. The scaled in-phase samples (I/E) 314bb, after passing through the analog converter (DAC) circuitry 347b1, is modulated by a signal ($\cos\omega_c t$) having a carrier frequency ($\omega_c$) whereas the scaled quadrature samples (Q/E) 316bb, analog converter (DAC) circuitry 347b2, is modulated by a signal ($\sin\omega_c t$) also having the same carrier frequency ($\omega_c$). Both of the scaled in-phase samples (I/E) 314bb and the scaled quadrature samples (Q/E) 316bb, after undergoing the operations described above are summed together to provide an output.

Figure 4:
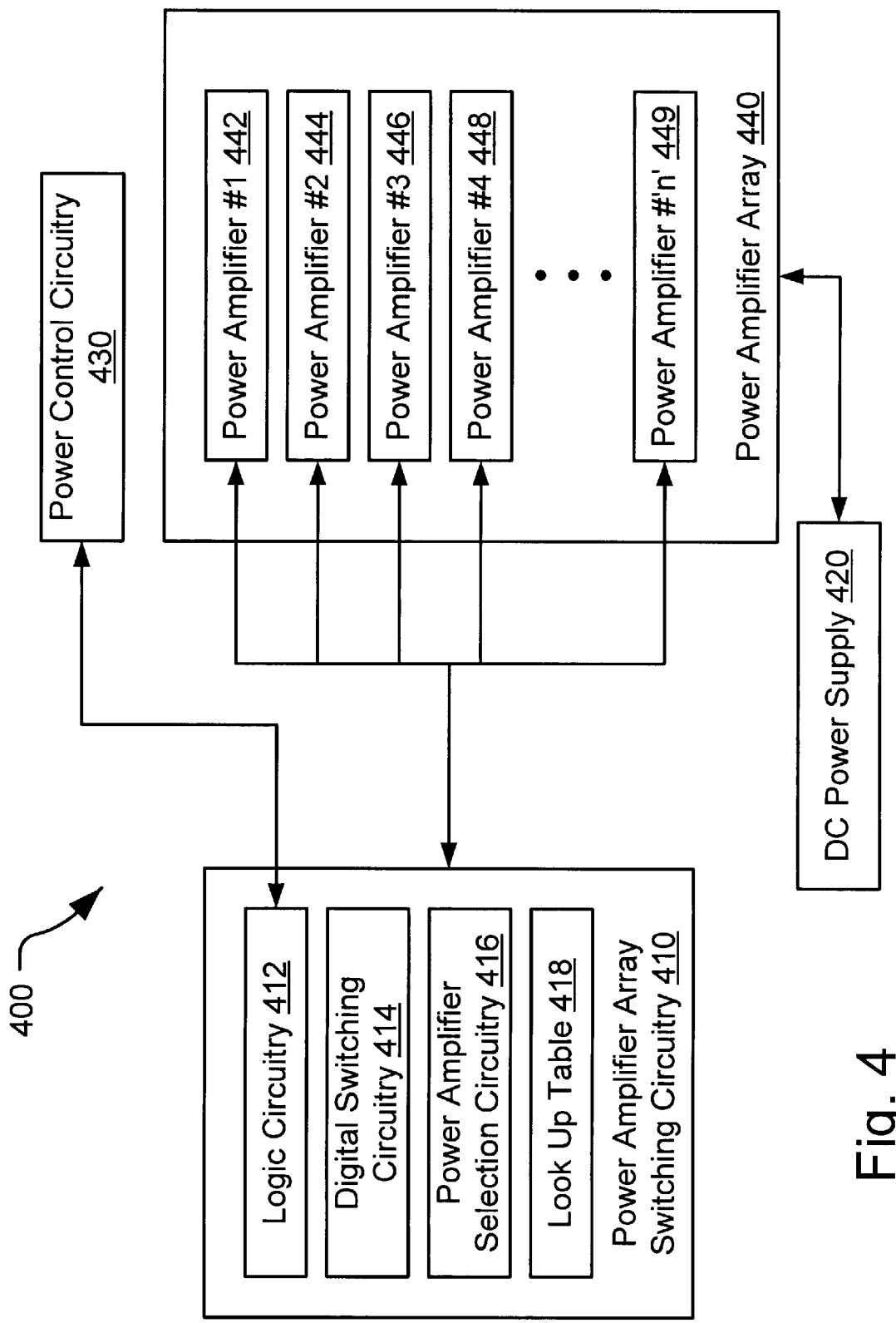
FIG. 4 is a system diagram illustrating one particular embodiment of a voltage switching structure for the power amplifier built in accordance with the invention as described in FIG. 1.

FIG. 4 is a system diagram illustrating one particular embodiment of a voltage switching structure 400 for a power amplifier built in accordance with the invention as described in FIG. 1. The voltage switching structure 400 contains, among other things, power amplifier array switching circuitry 410, a DC power supply 420, power control circuitry 430, and a power amplifier array 440. The power amplifier array switching circuitry 410 itself contains, among other things, logic circuitry 412, digital switching circuitry 414, power amplifier selection circuitry 416, and a look up table 418. The power amplifier array 440 itself contains, among other things, a power amplifier #1 442, a power amplifier #2 444, a power amplifier #3 446, a power amplifier #4 448, and a power amplifier #'n' 449. In certain embodiments of the invention, the logic circuitry 412 itself is not required, as a digital magnitude (envelope=E) is a digital word that inherently contains information that determines which power amplifiers of the power amplifier array 440 are to be switched ON or OFF. In such a case, no sophisticated logic circuitry 412 is required at all.

The power amplifier array switching circuitry 410 operates to determine which of the individual power amplifiers of the power amplifier array 440 are to be switched ON and OFF, namely, which of the power amplifier #1 442, the power amplifier #2 444, the power amplifier #3 446, the power amplifier #4 448, and the power amplifier #'n' 449 are to be switched ON and which are to be switched OFF. The power amplifier array switching circuitry 410 employs the power amplifier selection circuitry 416 to select which of the power amplifier #1 442, the power amplifier #2 444, the power amplifier #3 446, the power amplifier #4 448, and the power amplifier #'n' 449 are to be switched ON and which are to be switched OFF. In certain embodiments of the invention, a first predetermined number of the power amplifier #1 442, the power amplifier #2 444, the power amplifier #3 446, the power amplifier #4 448, and the power amplifier #'n' 449 are switched to ON; a second predetermined number of the power amplifier #1 442, the power amplifier #2 444, the power amplifier #3 446, the power amplifier #4 448, and the power amplifier #'n' 449 are switched to OFF. The logic circuitry 412 performs the processing to determine which of the power amplifier #1 442, the power amplifier #2 444, the power amplifier #3 446, the power amplifier #4 448, and the power amplifier #'n' 449 constitute the first predetermined number and the second predetermined number.

In other embodiments of the invention, the look up table 418 provides a predetermined profile to select which of the power amplifier #1 442, the power amplifier #2 444, the power amplifier #3 446, the power amplifier #4 448, and the power amplifier #'n' 449 are to be switched to ON and which are to switched to OFF. In addition, the look up table 418 is modified to accommodate the various impedances of the power amplifier #1 442, the power amplifier #2 444, the power amplifier #3 446, the power amplifier #4 448, and the power amplifier #'n' 449. The digital switching circuitry 414 operates cooperatively with the DC power supply 420 and the power control circuitry 430, via the logic circuitry 412, to control the switching of the power amplifier array 440. The DC power supply 420 provides a voltage to the power amplifier array 440 wherein the DC power supply 420 is capable of delivering up to a predetermined amount of current at a prescribed voltage.

Figure 5:
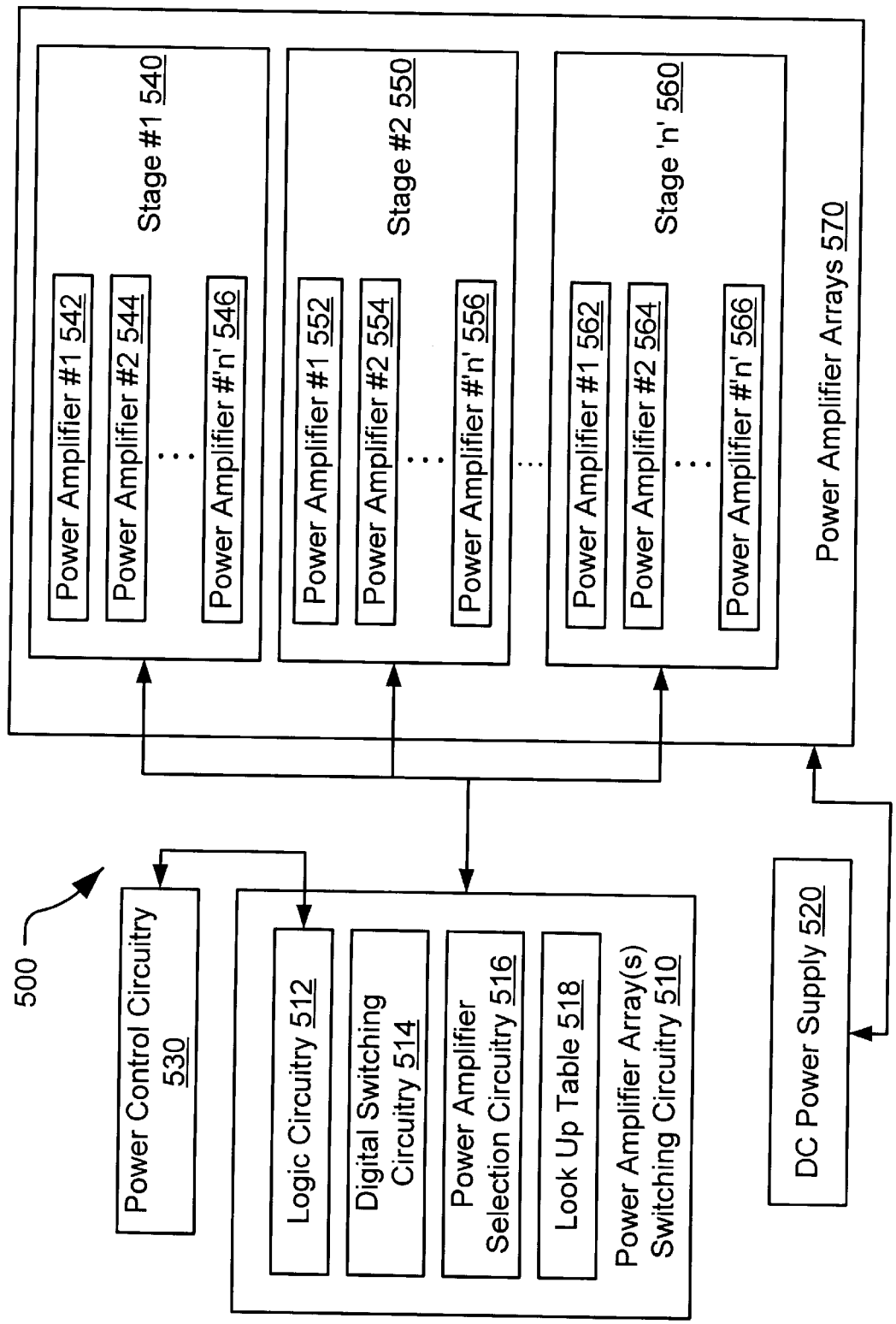
FIG. 5 is a system diagram illustrating one particular embodiment of the power amplifier built in accordance with the invention as described in FIG. 1 having a power amplifier having a plurality of power amplifier arrays.

FIG. 5 is a system diagram illustrating one particular embodiment of a power amplifier 500 built in accordance with the invention as described in FIG. 1. The power amplifier 500 contains a serially cascaded plurality of power amplifier arrays 570. The power amplifier 500 contains, among other things, power control circuitry 530, power amplifier array(s) switching circuitry 510, a DC power supply 520, and the serially cascaded plurality of power amplifier arrays 570. The power amplifier switching circuitry 510 itself contains, among other things, logic circuitry 512, digital switching circuitry 514, power amplifier selection circuitry 516, and a look up table 518. The serially cascaded plurality of power amplifier arrays 570 itself contains, among other things, a stage #1 power amplifier array 540, a stage #2 power amplifier array 550, and a stage #'n' power amplifier array 560. The stage #1 power amplifier array 540 itself contains, among other things, a power amplifier #1 542, a power amplifier #2 544, and a power amplifier #'n' 546. The stage #2 power amplifier array 550 itself contains, among other things, a power amplifier #1 552, a power amplifier #2 554, and a power amplifier #'n' 556. The stage #'n' power amplifier array 560 itself contains, among other things, a power amplifier #1 562, a power amplifier #2 564, and a power amplifier #'n' 566.

The power amplifier array switching circuitry 510 operates to determine which of the stage #1 power amplifier array 540, the stage #2 power amplifier array 550, and the stage #'n' power amplifier array 560 are to be switched ON and which are to be switched OFF. The stages are used for gross power control. In certain embodiments of the invention, the gross power control uses ranges of 10 dB or 20 dB per stage in certain embodiments of the invention. For example, to eliminate 20 dB of gain from the total gain provide by the stage #1 power amplifier array 540, the stage #2 power amplifier array 550, and the stage #'n' power amplifier array 560, an outer-most stage (e.g. the stage #'n' power amplifier array 560) is bypassed, and a direct connection is made to an antenna from the matched output of that stage. All of the intermediary stages preceding the stage directly connected to the antenna have array elements that are all switched ON. The stage directly connected to the antenna has array elements whose ON/OFF status are determined by the desired envelope level of the output. Those particular array elements are not necessarily all turned ON or OFF. For example, each array element of the stage #1 power amplifier array 540 and each array element the stage #2 power amplifier array 550 are switched ON, and the envelope governs which of the array elements of the stage #'n' power amplifier array 560 are switched ON and which of the array elements of the stage #'n' power amplifier array 560 are switched OFF.

One particular example to reduce the total gain by 20 dB is to completely switch OFF the stage #'n' power amplifier array 560 (assuming n=3), and then directly connect the stage #2 power amplifier array 550 to the antenna. Each array element of the stage #1 power amplifier array 540 is switched ON, and the envelope governs which of the array elements of the stage #2 power amplifier array 550 are switched ON and which of the array elements of the stage #2 power amplifier array 550 are switched OFF.

Moreover, the power amplifier array switching circuitry 510 operates to determine which of the individual power amplifiers of each of the stage #1 power amplifier array 540, the stage #2 power amplifier array 550, and the stage #'n' power amplifier array 560, namely; the power amplifier #1 542, the power amplifier #2 544, and the power amplifier #'n' 546 of the stage #1 power amplifier array 540; the power amplifier #1 552, the power amplifier #2 554, and the power amplifier #'n' 556 of the stage #2 power amplifier array 550; and the power amplifier #1 562, the power amplifier #2 564, and the power amplifier #'n' 566 of the stage #'n' power amplifier array 560 are to be switched ON and which are to be switched OFF. The power amplifier array switching circuitry 510 employs the power amplifier selection circuitry 516 to select which of the stage #1 power amplifier array 540, the stage #2 power amplifier array 550, and the stage #'n' power amplifier array 560 are to be switched ON and which are to be switched OFF in the manner described above.

In certain embodiments of the invention, a first predetermined number of the power amplifier #1 542, the power amplifier #2 544, and the power amplifier #'n' 546 of the stage #1 power amplifier array 540 are switched ON. A second predetermined number of the power amplifier #1 542, the power amplifier #2 544, and the power amplifier #'n' 546 of the stage #1 power amplifier array 540 are switched OFF. Similarly, a third predetermined number of the power amplifier #1 552, the power amplifier #2 554, and the power amplifier #'n' 556 of the stage #2 power amplifier array 550 are switched ON, and a fourth predetermined number of the power amplifier #1 552, the power amplifier #2 554, and the power amplifier #'n' 556 of the stage #2 power amplifier array 550 are switched OFF. Also similarly, a fifth predetermined number of the power amplifier #1 562, the power amplifier #2 564, and the power amplifier #'n' 566 of the stage #'n' power amplifier array 560 are switched ON, and a sixth predetermined number of the power amplifier #1 562, the power amplifier #2 564, and the power amplifier #'n' 566 of the stage #'n' power amplifier array 560 are switched OFF. The logic circuitry 512 performs the processing to determine which of the power amplifier #1 542, the power amplifier #2 544, and the power amplifier #'n' 546 of the stage #1 power amplifier array 540 constitute the first predetermined number and the second predetermined number, which of the power amplifier #1 552, the power amplifier #2 554, and the power amplifier #'n' 556 of the stage #2 power amplifier array 550 constitute the third predetermined number and the fourth predetermined number, and which of the power amplifier #1 562, the power amplifier #2 564, and the power amplifier #'n' 566 of the stage #'n' power amplifier array 560 constitute the fifth predetermined number and the sixth predetermined number.

In other embodiments of the invention, the look up table 518 provides a predetermined profile to select which of the power amplifier #1 542, the power amplifier #2 544, and the power amplifier #'n' 546 of the stage #1 power amplifier array 540, which of the power amplifier #1 552, the power amplifier #2 554, and the power amplifier #'n' 556 of the stage #2 power amplifier array 550, and which of the power amplifier #1 562, the power amplifier #2 564, and the power amplifier #'n' 566 of the stage #'n' power amplifier array 560 are to be are switched ON and which are switched OFF. In addition, the look up table 518 is modified to accommodate the various impedances of the stage #1 power amplifier array 540, the stage #2 power amplifier array 550, and the stage #'n' power amplifier array 560. Characteristics for digital pre-distortion compensation is included in the look up table 518 as determined by measurement of the serially cascaded plurality of power amplifier arrays 570 in certain embodiments of the invention. The digital switching circuitry 514 operates cooperatively with the DC power supply 520 and the power control circuitry 530, via the logic circuitry 512, to control the switching ON and OFF of each of the individual power amplifiers within the power amplifier arrays 570. The DC power supply 520 provides a voltage to the power amplifier arrays 570 wherein the DC power supply 520 is capable of delivering a predetermined amount of current.

The power amplifier 500 displays one particular embodiment having multiple power amplifier arrays, wherein each power amplifier array is operable of having a predetermined scaling of amplification. For example, if desired in certain embodiments of the invention, the stage #1 power amplifier array 540 possesses a first scaling of the power amplifier #1 542, the power amplifier #2 544, and the power amplifier #'n' 546 as a function of power. The stage #2 power amplifier array 550 possesses a second scaling of the power amplifier #1 552, the power amplifier #2 554, and the power amplifier #'n' 556 as a function of power. The stage #'n' power amplifier array 560 possesses a third scaling of the power amplifier #1 562, the power amplifier #2 564, and the power amplifier #'n' 566 as a function of power. Additional embodiments are envisioned in the invention wherein each of the power amplifiers within the multiple power amplifier arrays each have varying degrees scaling, both linear and logarithmic scaling if desired in various embodiments of the invention. For example, the stage #1 power amplifier array 540 is replaced with a "modified" stage #1 (linearly and log scaled) power amplifier array in certain embodiments of the invention. The other power amplifier arrays, the stage #2 power amplifier array 550 and the stage #'n' power amplifier array 560, are similarly replaced with a "modified" stage #2 (linearly and log scaled) power amplifier array, and a "modified" stage #'n' (linearly and log scaled) power amplifier array without departing from the scope and spirit of the invention.

Figure 6:
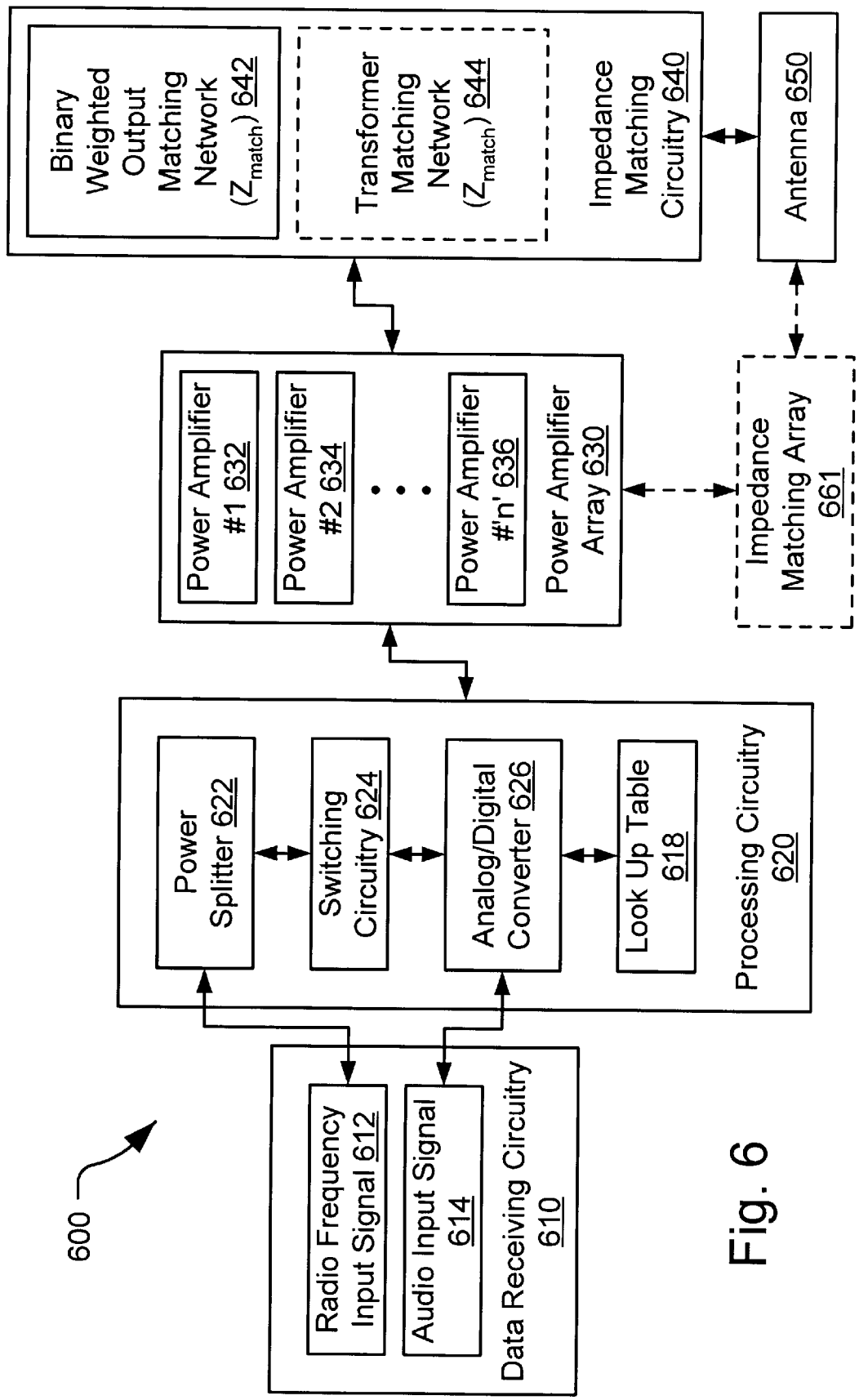
FIG. 6 is a system diagram illustrating another embodiment of the power amplifier built in accordance with the invention as described in FIG. 1.

FIG. 6 is a system diagram illustrating another embodiment of a power amplifier 600 built in accordance with the invention as described in FIG. 1. The power amplifier 600 contains, among other things, data receiving circuitry 610, processing circuitry 620, a power amplifier array 630, impedance matching circuitry 640, (in alternative embodiments) an impedance matching array 661, and an antenna 650. The data receiving circuitry 610 itself contains, among other things, a radio frequency (FM) input signal 612 and an audio input signal 614. The processing circuitry 620 itself contains, among other things, a power splitter 622, switching circuitry 624, a look up table 618, and an analog/digital converter (ADC) 626. The power amplifier array 630 itself contains, among other things, a power amplifier #1 632, a power amplifier #2 634, and a power amplifier #'n' 636. The impedance matching circuitry 640 itself contains, among other things, a binary weighted matching network ($Z_{match}$) 642, and either in place of or in conjunction with the binary weighted matching network ($Z_{match}$) 642, a transformer matching network ($Z_{match}$) 644. In addition, the impedance matching array 661 is used in alternative embodiments to communicatively couple the power amplifier array 630 to the antenna 650.

After the radio frequency (FM) input signal 612 and the audio input signal 614 of the data receiving circuitry 610 are received, the radio frequency (FM) input signal 612 is fed to the power splitter 622 of the processing circuitry 620, and the audio input signal 614 is fed to the analog/digital converter (ADC) 626 of the processing circuitry 620. The look up table 618 provides envelope pre-distortion compensation to the audio input signal 614 as it is fed to the analog/digital converter (ADC) 626 in accordance with the invention. The pre-distortion compensation is intrinsically includes in the digital to analog conversion performed by the analog/digital converter (ADC) 626. The power splitter 622 partitions the radio frequency (FM) input signal 612 before it is passed to the switching circuitry 624 of the processing circuitry 620. The switching circuitry 624 feeds the now-partitioned radio frequency (FM) input signal 612 to each of the power amplifier #1 632, the power amplifier #2 634, and the power amplifier #'n' 636 of the power amplifier array 630. The analog/digital converter (ADC) 626 simply feeds the audio input signal 614 into the switching circuitry 624 of the processing circuitry 620, after it has been digitized. In certain embodiments of the invention and in contrast to the feeding of the now-partitioned radio frequency (FM) input signal 612 to each of the power amplifier #1 632, the power amplifier #2 634, and the power amplifier #'n' 636 of the power amplifier array 630, the audio input signal 614, after being digitized by the analog/digital converter (ADC) 626, is fed by the switching circuitry 624 only into the power amplifier #'n' 636 of the power amplifier array 630. The switching circuitry 624 determines which of the power amplifier #1 632, the power amplifier #2 634, and the power amplifier #'n' 636 of the power amplifier array 630 are to be switched ON and which of the power amplifier #1 632, the power amplifier #2 634, and the power amplifier #'n' 636 of the power amplifier array 630 are to be switched OFF. The impedance matching array 661 is used in alternative embodiments to provide an array of impedances where any subset of the array of impedances can be matched up with the power amplifier array 630 to communicatively couple the power amplifier array 630 to the antenna 650. This switching configuration, biasing some to cutoff and some to saturation, is consistent with the switching described above in various embodiments of the invention as described in FIGS. 1–5.

The impedance matching circuitry 640 is employed to accommodate the various impedances of the power amplifier #1 632, the power amplifier #2 634 and the power amplifier #'n' 636 of the power amplifier array 630 and ensure proper signal transmission to the antenna 650. The impedance matching is geared substantially to match the impedance of the power amplifier array 630 to that of the impedance of the antenna 650 in certain embodiments of the invention. The impedance matching provided by the impedance matching circuitry 640 is to maximize signal transmission efficiency in certain embodiments of the invention; alternatively, the impedance matching provided by the impedance matching circuitry 640 is to minimize distortion and other perceptually related performance criteria in other embodiments of the invention. The impedance matching circuitry 640 serves as a band-pass filter and also as an element that maximizes efficiency; it also minimizes distortion (e.g. inter-modulation product and adjacent channel power emission ratio (ACPR)).

Various implementations are performed to do the impedance matching, including the binary weighted matching network ($Z_{match}$) 642 and the transformer-matching network ($Z_{match}$) 644. The binary weighted matching network ($Z_{match}$) 642 consists of a bank of predetermined impedances that are switched in to match the impedances of the power amplifier #1 632, the power amplifier #2 634, and the power amplifier #'n' 636 of the power amplifier array 630 that have been switched in to perform power amplification using the power amplifier 600. Depending on the particular impedances of the power amplifier #1 632, the power amplifier #2 634, and the power amplifier #'n' 636 that have been selected, the selected impedances from the bank of impedances constituting the binary weighted matching network ($Z_{match}$) 642 provide substantial impedance matching. The impedance matching as described above in various embodiments of the invention also provides for substantial suppression of harmonics (of the carrier frequency) created by transistor switching within power amplifier arrays of the invention, such as the power amplifier array 630 of FIG. 6.

In other embodiments of the invention, the binary weighted matching network ($Z_{match}$) 642 contains individual banks of impedance wherein each bank of impedance is dedicated to each one of the power amplifier #1 632, the power amplifier #2 634, or the power amplifier #'n' 636. Similarly, in certain embodiments of the invention, the transformer matching network ($Z_{match}$) 644 provides matching impedances to each one of the power amplifier #1 632, the power amplifier #2 634, or the power amplifier #'n' 636. If desired, combinations of the binary weighted matching network ($Z_{match}$) 642 and the transformer-matching network ($Z_{match}$) 644 are used without departing from the scope and spirit of the invention. For example, the transformer matching network ($Z_{match}$) 644 is used to provide the majority of the impedance matching of the impedance matching circuitry 640, and the binary weighted matching network ($Z_{match}$) 642 provides precision impedance matching to accommodate variations of impedance among the power amplifier #1 632, the power amplifier #2 634, and the power amplifier #'n' 636 and give a resolution of impedance matching that the transformer matching network ($Z_{match}$) 644. In certain embodiments of the invention, the antenna 650 is that of a cellular telephone. In other embodiments of the invention, the antenna 650 is that of a radio frequency transmitter. The antenna 650 is employed in any signal transmission system that requires power amplification.

Figure 7:
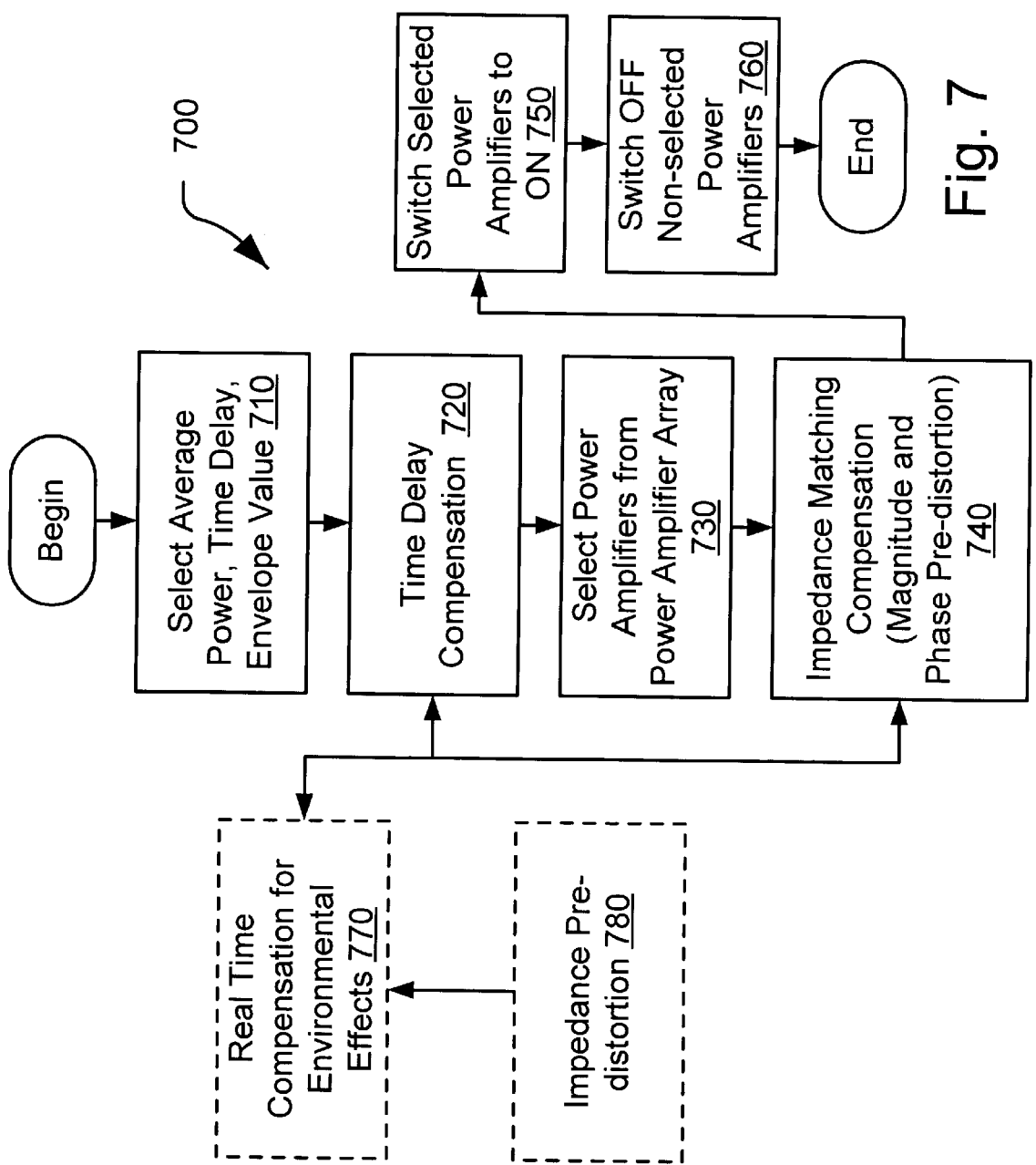
FIG. 7 is a functional block diagram illustrating a method of power amplification as performed in accordance with the present invention.

FIG. 7 is a functional block diagram illustrating a method of power amplification 700 as performed in accordance with the present invention. In a block 710, a desired level is selected. In a block 720, time delay compensation is performed. The time delay compensation that is performed in the block 720 is performed using any of the time delay compensation circuitries of the preceding Figures, including the time delay compensation circuitry 222 of FIG. 2 and the time delay compensation circuitry 336 of FIG. 3. Alternatively, a tapped delay line serves to provide the time delay compensation illustrated in the block 720 in other embodiments of the invention. Subsequently, in a block 730, a predetermined number of power amplifiers are selected from a power amplifier array. The predetermined number of power amplifiers are then used to perform power amplification. In a block 740, impedance matching compensation (magnitude and phase pre-distortion) is performed.

The impedance matching compensation (magnitude and phase pre-distortion) of the block 740 is performed using the impedance matching circuitry 640 of FIG. 6 in certain embodiments of the invention; specifically, it is performed using the binary weighted matching network ($Z_{match}$) 642, and/or the transformer matching network ($Z_{match}$) 644, both of FIG. 6. If desired and in certain embodiments of the invention, in an optional block 770, real time compensation for environmental effects is performed to either one or both of the functions performed in the blocks 730 and 740. The environmental effects are a number of effects in various embodiments of the invention including, among other things, temperature, humidity, radio frequency ther reference and electromagnetic interference.

Real time compensation in response to any environmental effects that would affect the time delay and the impedance of the various circuitry within the invention is included within the operation of the optional block 770. Also, in a block 780, digital pre-distortion compensation of the impedance of the various circuitry within the invention is one method to assist in the performance of real time compensation in response to any environmental effects. In certain embodiments of the invention, the real time compensation for environmental effects of the optional block 770 is performed using the processing circuitry 220 of FIG. 2; alternatively, the real time compensation for environmental effects of the optional block 770 is performed using the processing circuitry 330 of FIG. 3. In other embodiments of the invention, the real time compensation for environmental effects of the optional block 770 is performed using the processing circuitry 620 of FIG. 6. In a block 750, the predetermined number of power amplifiers that are selected from the power amplifier array in the block 720 are switched to ON, and in a block 760, the remaining (non-selected) power amplifiers that are not selected from the power amplifier array in the block 720 are switched to OFF.

In certain embodiments of the invention, the control circuitry 130 of FIG. 1 that controls the voltage or current being given to the power amplifier array 140, also of FIG. 1, is used to perform the switching ON and switching OFF of the predetermined number of power amplifiers with a voltage that pushes them to saturation (i.e., ON), as shown in the block 750. Also in certain embodiments of the invention, the remaining (non-selected) power amplifiers that are not selected from the power amplifier array in the block 720, as shown in the block 760, are provided with a voltage that pushes them to cutoff (OFF) using the control circuitry 130 of FIG. 1. In other embodiments of the invention, the switching to ON/OFF performed in the block 750 and the block 760 is completed using the control circuitry 230 of FIG. 2. In even other embodiments of the invention, the switching to ON/OFF performed in the block 750 and the block 760 is completed using the power amplifier array switching circuitry 410 of FIG. 4.

Figure 8:
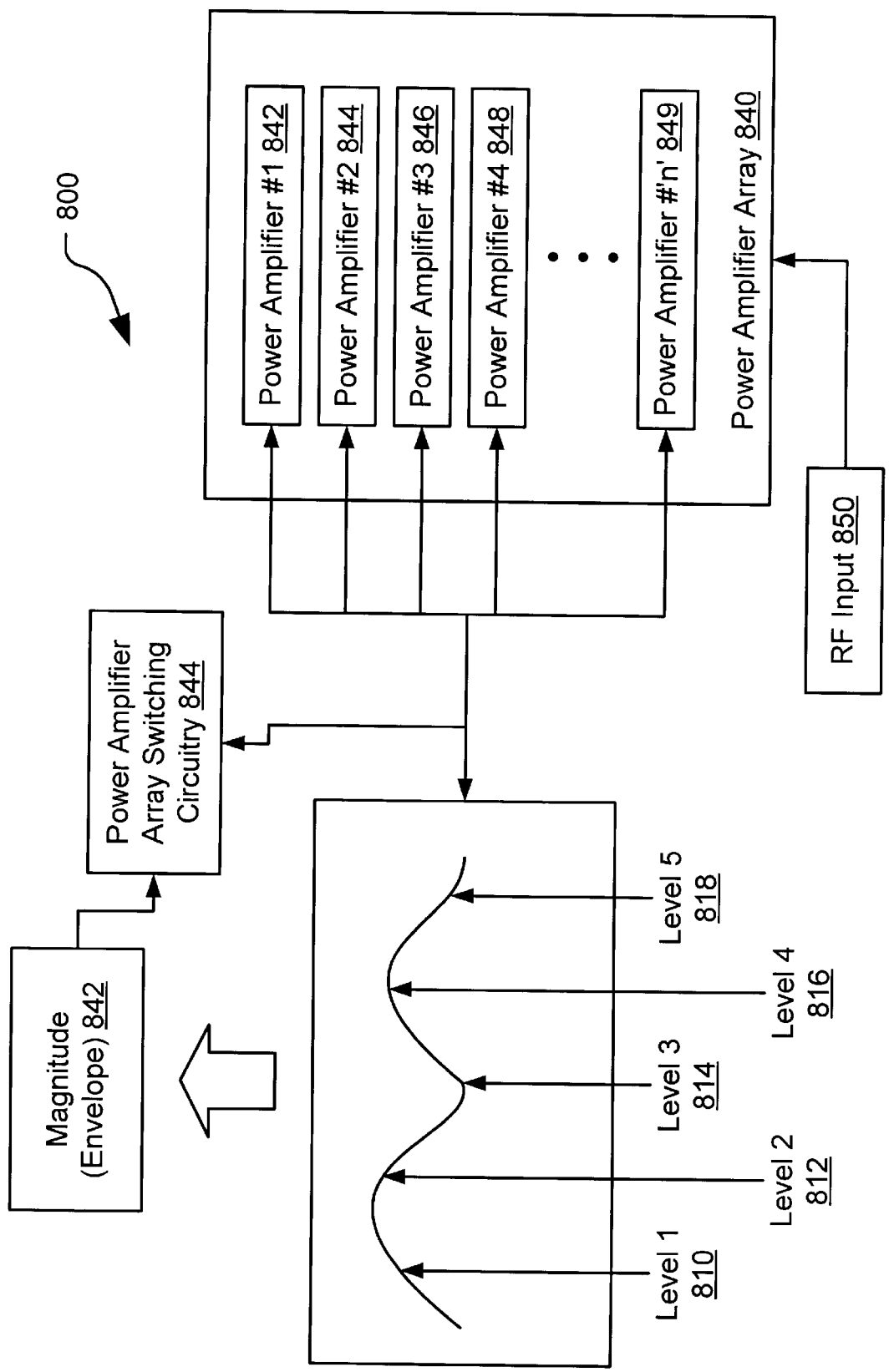
FIG. 8 is a system diagram illustrating one particular embodiment of a voltage switching structure for the power amplifier built in accordance with the invention as described in FIG. 1.

FIG. 8 is a system diagram illustrating one particular embodiment of a voltage switching structure 800 for the power amplifier built in accordance with the invention as described in FIG. 1. The voltage switching structure 800 utilizes a magnitude (envelope) 842 to feed a power amplifier array switching circuitry 844 that subsequently drives a power amplifier array 840. The magnitude (envelope) 842 possesses various samples of the magnitude (envelope) 842, namely, a level 1 810, a level 2 812, a level 3 814, a level 4 816, and a level 5 818 to drive the power amplifier array 840 via the power amplifier array switching circuitry 844. Any number of various samples of the magnitude (envelope) 842 are used in other embodiments of the invention. A RF input is also fed to the power amplifier array 840. The power amplifier array 840 itself contains a power amplifier #1 842, a power amplifier #2 844, a power amplifier #3 846, a power amplifier #4 848, and a power amplifier #'n' 849.

Depending on the size of the level 1 810, a predetermined number of the power amplifier #1 842, the power amplifier #2 844, the power amplifier #3 846, the power amplifier #4 848, and the power amplifier #'n' 849 are switched to ON, as described above in other embodiments of the invention. For example, the power amplifier #1 842 and the power amplifier #2 844 are the only two power amplifiers of the power amplifier array 840 for the level 1 810 having a certain value. The remaining power amplifiers, namely, the power amplifier #3 846, the power amplifier #4 848, and the power amplifier #'n' 849, are switched to OFF.

Similarly, depending on the size of the level 2 812, a predetermined number of the power amplifier #1 842, the power amplifier #2 844, the power amplifier #3 846, the power amplifier #4 848, and the power amplifier #'n' 849 are switched ON, as described above in other embodiments of the invention. For examples, for this particular value of the level 2 812, all of the power amplifiers of the power amplifier array 840 are required for the level 2 812 having a certain value. All of the power amplifier #1 842, the power amplifier #2 844, the power amplifier #3 846, the power amplifier #4 848, and the power amplifier #'n' 849 are provided with a voltage of saturation (ON) and none of the power amplifier #1 842, the power amplifier #2 844, the power amplifier #3 846, the power amplifier #4 848, and the power amplifier #'n' 849 are switched to OFF.

Those having skill in the art of communications signal processing will recognize that a similar procedure is used to provide the voltage switching of the level 3 814, the level 4 816, and the level 5 818 to drive the power amplifier array 840. A predetermined number of the power amplifier #1 842, the power amplifier #2 844, the power amplifier #3 846, the power amplifier #4 848, and the power amplifier #'n' 849 are switched to ON to accommodate the various levels of the magnitude (envelope) 842, namely, the level 1 810, the level 2 812, the level 3 814, the level 4 816, and the level 5 818. The remaining power amplifiers of the power amplifier array 840 as required by the magnitude (envelope) 842. The switching of the various power amplifiers of the power amplifier array 840 is performed in real time and maintains a high perceptual quality of the magnitude (envelope) 842.

In view of the above detailed description of the present invention and associated drawings, other modifications and variations will now become apparent to those skilled in the art. It should also be apparent that such other modifications and variations may be effected without departing from the spirit and scope of the present invention.

What is claimed is:

1. A power amplifier that amplifies an electrical signal, the electrical signal having a magnitude that traverses a first path within the power amplifier to an antenna and a phase that traverses a second path within the power amplifier to the antenna, the power amplifier comprising:

a plurality of power amplifiers;

a power supply that switches on at least one power amplifier within the plurality of power amplifiers;

a logic circuitry coupled to the power supply that directs the switching on of the at least one power amplifier within the plurality of power amplifiers;

a time delay compensation circuitry that substantially minimizes any time delay mismatch between the first path and the second path within the power amplifier;

a pre-distortion circuitry that substantially compensates for any impedance mismatch created by any changes in the magnitude; and a look up table that stores a gain profile and a phase profile of at least one power amplifier of the plurality of power amplifiers.

2. The power amplifier of claim 1, wherein the electrical signal comprises a radio frequency component and an audio component.

3. The power amplifier of claim 1, wherein the electrical signal comprises an in-phase component and a quadrature component, each of the in-phase component and the quadrature component modulates a radio frequency carrier.

4. The power amplifier of claim 1, wherein the plurality of power amplifiers is partitioned into a plurality of power amplifier arrays.

5. The power amplifier of claim 4, wherein at least one power amplifier array of the plurality of power amplifier arrays has a gain profile and a phase profile that is linearly scaled.

6. The power amplifier of claim 1, further comprising a power amplifier selection circuitry that selects a predetermined number of power amplifiers of the plurality of power amplifiers to be switched on; and the power amplifier selection circuitry selects a remaining number of power amplifiers of the plurality of power amplifiers to be switched off.

7. The power amplifier of claim 1, further comprising a look up table that stores an impedance characterization of the plurality of power amplifiers.

8. A power amplifier that amplifies an electrical signal, the power amplifier comprising:

a plurality of power amplifiers;

a control circuitry that switches on at least one power amplifier of the plurality of power amplifiers; and a pre-distortion circuitry that provides digital pre-distortion to the electrical signal.

9. The power amplifier of claim 8, wherein:

the electrical signal comprises a magnitude and a phase;

the magnitude passes through a first path of the plurality of power amplifiers;

the phase passes through a second path of the plurality of power amplifiers; and the electrical signal is provided to an antenna; and further comprising:

a time delay compensation circuitry that substantially minimizes any time delay mismatch between the first path and the second path; and the pre-distortion circuitry substantially compensates for any impedance mismatch created by any changes in the magnitude.

10. The power amplifier of claim 9, wherein:

the time delay compensation circuitry that substantially minimizes any time delay mismatch between the first path and the second path performs the time delay compensation in real time; and the pre-distortion circuitry that substantially compensates for any impedance mismatch created by an environmental effect.

11. The power amplifier of claim 8, wherein:

the control circuitry switches on a predetermined number of power amplifiers of the plurality of power amplifiers; and the control circuitry switches off a remaining number of power amplifiers of the plurality of power amplifiers.

12. The power amplifier of claim 8, wherein the plurality of power amplifiers comprises a plurality of power amplifier arrays.

13. The power amplifier of claim 12, wherein at least one power amplifier array has an output profile that is binary scaled.

14. The power amplifier of claim 8, further comprising a look up table that stores an impedance characterization of the plurality of power amplifiers.

15. The power amplifier of claim 14, further comprising an impedance matching array.

16. The power amplifier of claim 8, further comprising a look up table that stores an output profile of at least one power amplifier of the plurality of power amplifiers.

17. A method of power amplification comprising:

selecting at least one power amplifier from a plurality of power amplifiers;

switching on the at least one power amplifier of the plurality of power amplifiers with a voltage; and performing digital pre-distortion compensation to an electrical signal that is provided to the at least one power amplifier from a plurality of power amplifiers.

18. The method of claim 17, further comprising:

minimizing any time delay mismatch between a first electrical signal path and a second electrical signal path within the power amplifier, the first electrical signal path and the second electrical signal path terminate at an antenna; and compensating for any impedance mismatch created by any changes in a magnitude.

19. The method of claim 17, further comprising:
selecting a predetermined gain from a look up table that stores a gain profile of at least one power amplifier of the plurality of power amplifiers; and
selecting a predetermined number of power amplifiers of the plurality of power amplifiers to provide the predetermined gain.

20. The method of claim 17, wherein the plurality of power amplifiers comprises a plurality of power amplifier arrays; and
at least one of the plurality of power amplifier arrays is binary scaled.

* * * * *